United States Patent
Kamperman et al.

(10) Patent No.: US 9,242,412 B2
(45) Date of Patent: Jan. 26, 2016

(54) METHOD AND APPARATUS FOR MAKING PARTIALLY COATED PRODUCTS

(75) Inventors: Nicodemus Frederikus Kamperman, Lieshout (NL); Roland Anthony Tacken, Geldrop (NL); Lambertus Theodorus Gerardus Van De Vorst, Eindhoven (NL)

(73) Assignee: Nederlandse Organisatie voor toegepast-natuurwetenschappelijk Onderzoek TNO, Delft (NL)

( * ) Notice: Subject to any disclaimer, the term of this patent is extended or adjusted under 35 U.S.C. 154(b) by 743 days.

(21) Appl. No.: 12/515,919

(22) PCT Filed: Nov. 23, 2007

(86) PCT No.: PCT/NL2007/050590
§ 371 (c)(1),
(2), (4) Date: Sep. 18, 2009

(87) PCT Pub. No.: WO2008/063069
PCT Pub. Date: May 29, 2008

(65) Prior Publication Data
US 2010/0021639 A1    Jan. 28, 2010

(30) Foreign Application Priority Data
Nov. 23, 2006  (EP) ..................... 06077077

(51) Int. Cl.
*B05D 1/32*    (2006.01)
*B29C 67/00*   (2006.01)
*H05K 3/04*    (2006.01)

(52) U.S. Cl.
CPC ............ *B29C 67/0077* (2013.01); *H05K 3/048* (2013.01)

(58) Field of Classification Search
CPC ........................ B29C 67/0077; H05K 3/048
USPC ........ 427/154, 155, 156, 256, 259, 282, 468, 427/510
See application file for complete search history.

(56) References Cited

U.S. PATENT DOCUMENTS

| | | | |
|---|---|---|---|
| 5,173,220 A | | 12/1992 | Reiff et al. |
| 5,178,976 A | * | 1/1993 | Rose et al. ............... 430/5 |

(Continued)

FOREIGN PATENT DOCUMENTS

| | | |
|---|---|---|
| DE | 100 33 794 C1 | 1/2002 |
| JP | 06-099134 | 4/1994 |

(Continued)

OTHER PUBLICATIONS

International Search Report dated Mar. 19, 2008, for PCT/NL2007/050590.

*Primary Examiner* — Xiao Zhao
(74) *Attorney, Agent, or Firm* — Leydig, Voit & Mayer, Ltd.

(57) ABSTRACT

Method and system for making a partially coated product (5) having at least one coated area (6) and at least one non-coated area (7). Means (1) are provided for providing a digital representation of the product, including a cover layer (8) for each intended non-coated area which covers the intended non-coated area (7) and an isolation layer between them (9) which is isolated from the product's outside surface. A production device (2) is provided which is arranged to produce the product, including its respective cover and isolation layers under control of the digital representation. Means (3) for coating (10) the product are provided, including its respective cover layers. Finally, removing means (4) are provided which are arranged for removing the respective cover and, when applicable, isolation layers, including their coating, from the respective intended non-coated areas.

12 Claims, 1 Drawing Sheet

(56) References Cited

U.S. PATENT DOCUMENTS

| | | | |
|---|---|---|---|
| 5,234,636 A | 8/1993 | Hull et al. | |
| 2001/0045361 A1 | 11/2001 | Boone | |
| 2002/0066966 A1* | 6/2002 | Farnworth | 257/787 |
| 2002/0195419 A1* | 12/2002 | Pavelchek | 216/16 |
| 2003/0012925 A1* | 1/2003 | Gorrell | 428/137 |
| 2003/0087038 A1* | 5/2003 | Su et al. | 427/420 |
| 2004/0041898 A1* | 3/2004 | Nakamura | 347/172 |
| 2004/0265492 A1* | 12/2004 | Free et al. | 427/256 |

FOREIGN PATENT DOCUMENTS

| | | |
|---|---|---|
| JP | 2006-028639 A | 2/2006 |
| JP | 2006-065306 A | 3/2006 |
| WO | WO 00/67981 A | 11/2000 |

\* cited by examiner

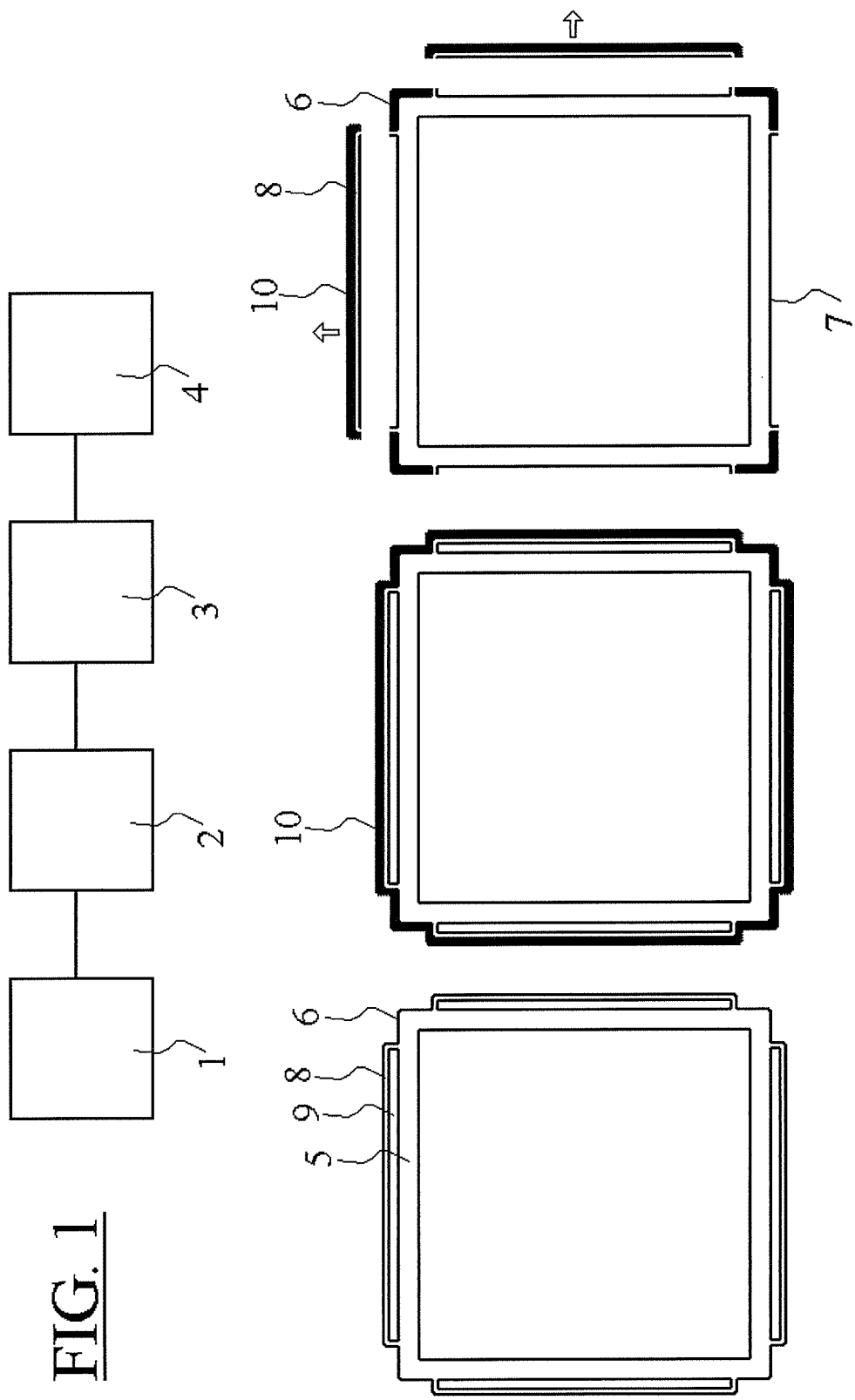

METHOD AND APPARATUS FOR MAKING PARTIALLY COATED PRODUCTS

FIELD OF THE INVENTION

The invention refers to a method and a system for making a partially coated product having at least one coated area and at least one non-coated area.

BACKGROUND

Coating of plastics is common practice now for years, for example for the metallization of plastics. Selective metallization of e.g. plastic or ceramic products is an upcoming discipline, originated by the advent of technologies like MID, MEMS, two components die casting, and the aim at miniaturization and weight saving. One important aim of metallization is to obtain light weight products comprising electrically conductive circuits upon (three dimensional) products like electrical connector parts, sensors, actuators, antennas etc. By means of selective metallization traditional loose copper wires may be replaced by integrated metal traces upon the product surface. The developments during the last years clearly focus on 3-D applicable techniques.

SUMMARY

It is an object to provide for partial coating of products that is adapted to products with complex 3 D shapes.

A method is provided for making a partially coated product having at least one coated area and at least one non-coated area, comprising steps of:
  providing a digital representation of the product, including, for each intended non-coated area, a removable cover layer arranged for temporarily covering that area;
  sequentially delivering energy and/or material to specified points in space to produce the removable cover layer on the product, under control of the digital representation of the product;
  coating the product, including the cover layer for each intended non-coated area;
  removing the cover layer for each intended non-coated area from the product, including the coating on the cover layer.

So each surface area of the product which has not to be coated or cladded in the final stage, is provided first with a cover layer covering those areas not to be coated, the whole product is coated (or cladded) and finally the cover layers are taken away e.g. by cutting, breaking, milling etc., thus uncovering the underlying not coated surface areas.

As the cover layer, which covers each intended non-coated area, is isolated from that area by means of an isolation layer, e.g. having the shape of a very thin, flat chamber, the product may be made by means of a "Rapid Manufacturing" (RM) technique, which may be defined as a sequential delivery of energy and/or material to specified points in space to produce the product under control of the digital representation of the product created with the aid of a computer.

One form of RM technique which may be fit is Selective Laser Sintering (SLS®, a registered trademark of 3D Systems, Inc.), an additive rapid manufacturing technique that uses a high power laser (for example, a carbon dioxide laser) to fuse small particles of plastic, metal or ceramic powders into a mass representing the desired 3-dimensional product. The laser selectively fuses powdered material by scanning cross-sections generated from a 3-D digital description of the part (e.g. from a CAD file or scan data) on the surface of a powder bed. After each cross-section is scanned, the powder bed is lowered by one layer thickness, a new layer of material is applied on top, and the process is repeated until the product is completed.

There is also provided a system for making a partially coated product (5) having at least one coated area (6) and at least one non-coated area (7), comprising
  means (1) for providing a digital representation of the product, including a removable cover layer (8) for each intended non-coated area which covers the intended non-coated area (7); and
  a production device (2) which is arranged to produce the cover layer on the product, by sequentially delivering energy and/or material to specified points in space to produce the cover layer on the product, under control of the digital representation;
  means (3) for coating (10) the product, including the cover layers for each intended non-coated area;
  removing means (4) which are arranged for removing the cover layer for each intended non-coated area from the at least one intended non-coated area.

The method and system may, as an example, be used for enabling selective seeding or advanced activation of a product with a "coating" of catalyst particles that can initiate successive electroless metal deposition of e.g. copper. In this way e.g. 3-dimensional electrical circuits can be made at the surfaces of respective products.

BRIEF DESCRIPTION OF THE DRAWING

Hereinafter an exemplary embodiment will be described using the following figures.

FIG. 1 shows schematically an exemplary production configuration which is arranged for making a partially coated product;

FIG. 2 shows schematically the production steps;

EXEMPLARY EMBODIMENT

The system of FIG. 1 comprises a computer system 1 which is suitable for providing a digital representation of a partially coated product 5, having—in its finished state—coated surfaces 6 and uncoated surfaces 7 (see FIG. 2), which system 1 is connected with a production device 2 which is arranged to produce the (still uncoated) product 5 under control of the digital representation received from system 1.

The product 5 comprises cover layers 8, each covering an intended non-coated area 7, isolated from that area by an isolation layer 9, having the shape of a chamber. The chamber may be very thin and/or flat and may even have the shape of a sheet and which may be "empty" or filled with a gas, a liquid, a powder or a solid. The product may be made by means of a "Rapid Manufacturing" (RM) technique, well known in the art, which may be defined as a sequential delivery of energy and/or material to specified points in space to produce the product under control of the digital representation of the product created with the aid of a computer. Cover layers 8 may reach onto product 5 adjacent non-coated areas 7, for example along a rim around such areas, to form side walls of the chamber. Optionally, such walls may sub-divide a larger area into a plurality of non-coated areas 7. When the chamber is not "empty", but filled powder or solid, it may be possible to omit the side walls.

One form of RM technique which may be fit is Selective Laser Sintering (SLS®, registered by 3D Systems, Inc.), an additive rapid manufacturing technique that uses a computer and a high power laser (for example, a carbon dioxide laser)

for fusing small particles of plastic, metal or ceramic powders into a mass at scannable positions relative to the product. The computer contains information representing the desired 3-dimensional product and the cover layers. The computer controls the laser to selectively fuse powdered material by scanning cross-sections generated from a 3-D digital description of the part (e.g. from a CAD file or scan data in the computer) on the surface of a powder bed. After each cross-section is scanned, the powder bed is lowered by one layer thickness, a new layer of material is applied on top, and the process is repeated until the product is completed.

Alternatively, stereolithography may be used, in which resin is cured at selectable positions by directing a laser at the selectable positions relative to the product under control of a computer that contains a 3-D digital description of the part and the cover layers. The computer controls the laser dependent on the description. As a further alternative fused deposition may be used. Herein a computer and a deposition device are provided. The computer stores a model of the product and the cover layers and controls the deposition device to emit material from an outlet of the deposition device at selected positions.

In an embodiment product 5 and the cover layer 8 are made together in a single process of sequentially delivering energy and/or material to specified points in space in this way. In another embodiment, product 5 may first be made separately in any convenient way, cover layer 8 being applied subsequently on selected areas of product 5 by sequentially delivering energy and/or material to specified points in space.

The configuration illustrated in FIG. 1 further comprises a coating (or cladding) system 3 in which the product, after being made in the production device 2, is provided with a coating or cladding layer 10 which is applied on the whole surface of the product which can be reached by the coating or cladding medium, which may be fluid or gaseous. As the isolation layer 9—due to its isolation—cannot be reached by the fluid or gaseous cladding medium, the respective internal surface will not be coated or cladded.

Coating may be performed by immersing the product in a bath, by using a sprayer or by placing the product in a chamber with a sputtering source, a gas or vapor source etc. for depositing material. Coating may also be performed by a mechanical applicator such as a brush.

In an embodiment the coating may be used for metallization. However, alternatively other types of coating may be applied, of for example adhesive, a protective layer, coloring material etc.

It may be noted that it may be preferred that the isolation layer is "empty", i.e. there may vacuum inside of it is filled with air or gas, e.g. depending of the production circumstances under which the not-coated product was made. However, it could be preferred to fill the isolation layer with a more or less solid material, which can easily be inserted when using (two component) RM or SLS production techniques. In the case of SLS the chamber may be filled with e.g. not-molten powder, or powder that has only partially been molten, i.e. with less interconnection of powder particles than in cover layer 8. In other words, in this case the isolation layer is formed by a layer consisting of not-molten powder, or less-molten powder. In a similar way, when e.g. using stereolithography, the isolation layer may consist of not-cured resin or less cured resin. The isolation layer 8 may also be formed of (thin) layer of any material which prevents that the cover layer 8 and the intended non-coated area 7 do not stick to another, thus enabling convenient removal of the cover layer 8. In summary, the isolation layer 8 may be formed by any kind of (vacuum, gaseous, liquid or solid) layer preventing the inner surface of the cover layer 8 and the surface area 7 to stick, thus enabling easy removal of the cover layer 8. The isolation layer differs from the cover layer 8. The composition or material state of the isolation layer is selected so that that the isolation layer sticks at least with less strength to the product than cover layer 8. Alternatively, cover layer 8 may be made of a different material than product 5 that only sticks lightly to product 5 in the sense that it may be removed with a small force that is smaller than forces that would damage product 5. Less strong material of the same composition as product 5 may also be used in cover layer 8. However, use of an isolation layer has the advantage that a relatively strong cover layer 8 may be used, which may be of the same composition and strength as the material of product 5, at the same time making it easy to remove the cover layer.

After the product's outside surface 10 (including the areas 6) has been coated entirely, the non-coated areas 7 can be unveiled by removing, by (e.g. mechanical) removing means 4, the cover layer 8, including its coating 10, from the non-coated areas 7. The removing means may include for example a cutter for manual or machine removal, a milling machine, a vibrating device which may contact the product to detach or destroy cover layer 8, suction cups, adhesive clamps etc. to grip and pull off the cover layer.

The invention claimed is:

1. A method for making a partially coated product having a coated area and a non-coated area, the method comprising:
    providing a digital representation of an intermediate form for producing the partially coated product, the intermediate form including:
    a product, and
    a removable cover layer, for an intended non-coated area of the product, isolated from the intended non-coated area of the product, the removable cover layer being arranged for temporarily covering the intended non-coated area of the product;
    making, under control of the digital representation of the intermediate form, both the product and the removable cover layer together by sequentially performing at specified points in space:
    providing a material, from which the product and the removable cover layer are to be formed, in a space wherein the product and the removable cover layer are to be formed, and
    delivering energy to the specified points in space to produce the product and the removable cover layer on the product both from said material;
    providing, for the intermediate form, a coating on both the product and the removable cover layer for the intended non-coated area of the product; and
    removing, from the intermediate form after providing the coating, the removable cover layer including the coating.

2. Method according to claim 1, wherein the digital representation includes, for each intended non-coated area, an isolation layer between the intended non-coated area and the removable cover layer for the intended non-coated area, the removable cover layer being produced isolated from the intended non-coated area on the product by the isolation layer.

3. The method according to claim 2, wherein the product and the removable cover layer are made by fusing a powder, and the isolation layer comprises the powder in an unfused state or less fused state than the product and the removable cover layer.

4. The method according to claim 2, wherein the product and the removable cover layer are made by curing a resin, and the isolation layer comprises the resin in an uncured or less cured state than the product and the removable cover layer.

5. Method according to claim 1, wherein the removable cover layer is produced isolated from the intended non-coated area on the product by a chamber between the intended non-coated area and the removable cover layer, the chamber containing a part of the material to which said energy has not been delivered.

6. The method according to claim 5, further comprising sequentially delivering said energy to specified points in said space where the removable cover layer reaches onto the product adjacent the non-coated area.

7. The method according to claim 6, wherein the removable cover layer includes side walls of the chamber.

8. Method according to claim 1, wherein the product is made by a Rapid Manufacturing (RM) technique, comprising a sequential delivery of energy to specified points in space to produce the product under control of the digital representation of the product.

9. A method for making a partially coated product having a coated area and a non-coated area, the method comprising:
providing a digital representation of an intermediate form for producing the partially coated product, the intermediate form including:
a product, and
a removable cover layer, for an intended non-coated area of the product, isolated from the intended non-coated area of the product, the removable cover layer being arranged for temporarily covering the intended non-coated area of the product;
making, under control of the digital representation of the intermediate form, both the product and the removable cover layer during a same process of material delivery, wherein during the same process of material delivery material is sequentially delivered to specified points in space, according to the digital representation of the intermediate form, to produce both the product and the removable cover layer from a same material, the specified points comprising points in the product and the removable cover layer;
providing, for the intermediate form, a coating on both the product and the removable cover layer for the intended non-coated area of the product; and
removing, from the intermediate form after providing the coating, the removable cover layer including the coating.

10. The method according to claim 9, wherein the digital representation of the intermediate form for producing the partially coated product includes, for each intended non-coated area, a description of an isolation layer between the intended non-coated area and the removable cover layer for the non-coated area, the removable cover layer being produced, during the same process of material delivery, by said sequential delivery of material at locations that are isolated by the isolation layer from the non-coated area on the product.

11. The method according to claim 9, wherein the product is made by a Rapid Manufacturing (RM) technique, comprising a sequential delivery of energy to specified points in space to produce the product under control of the digital representation of the product.

12. The method according to claim 9, wherein the digital representation of the intermediate form for producing the partially coated product includes, for each intended non-coated area, a description of an isolation layer between the intended non-coated area and the removable cover layer for the non-coated area, the removable cover layer being produced, during the same process of material delivery, isolated from the non-coated area on the product by forming a chamber between the non-coated area and the removable cover layer, the method comprising sequentially delivering the material to specified points in said space where the removable cover layer reaches onto the product adjacent the non-coated area, whereby the removable cover layer includes side walls of the chamber.

* * * * *